US012813202B2

(12) United States Patent
Gould et al.

(10) Patent No.: US 12,813,202 B2
(45) **Date of Patent: *Nov. 24, 2026**

(54) TRANSFER ROBOT FOR REDUCED FOOTPRINT PLATFORM ARCHITECTURE

(71) Applicant: LAM RESEARCH CORPORATION, Fremont, CA (US)

(72) Inventors: Richard H. Gould, Keller, TX (US); Richard Blank, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 339 days.

This patent is subject to a terminal disclaimer.

(21) Appl. No.: 18/581,084

(22) Filed: Feb. 19, 2024

(65) Prior Publication Data

US 2024/0194505 A1 Jun. 13, 2024

Related U.S. Application Data

(60) Continuation of application No. 17/981,997, filed on Nov. 7, 2022, now Pat. No. 11,908,714, which is a
(Continued)

(51) Int. Cl.
*H10P 72/00* (2026.01)
*H10P 72/30* (2026.01)

(52) U.S. Cl.
CPC ...... *H10P 72/0466* (2026.01); *H10P 72/3302* (2026.01); *H10P 72/3402* (2026.01); *H10P 72/0458* (2026.01)

(58) Field of Classification Search
CPC ............. H10P 72/0466; H10P 72/3302; H10P 72/3402
See application file for complete search history.

(56) References Cited

U.S. PATENT DOCUMENTS 5,019,233 A * 5/1991 Blake .................. H10P 72/3306 414/217
5,789,890 A 8/1998 Genov et al.
(Continued)

FOREIGN PATENT DOCUMENTS

JP H0982780 A 3/1997
JP H10335410 A 12/1998
(Continued)

OTHER PUBLICATIONS

Daihen, "6-axis Vertical Articulated Robot UTM-R3700F Wide range operation without Y-axis track," Information in this catalog is accurate as of Aug. 2017, pp. 1-2.
(Continued)

*Primary Examiner* — James Keenan
(74) *Attorney, Agent, or Firm* — Weaver Austin Villeneuve & Sampson LLP

(57) ABSTRACT

A transfer robot assembly arranged within an ATV transfer module includes a transfer robot that includes an end effector and one or more arm segments connected between the end effector and a transfer robot platform. A first robot alignment arm is connected to the transfer robot platform. A second robot alignment arm is connected to the first robot alignment arm and to a mounting chassis of the ATV transfer module. The transfer robot assembly is configured to actuate the first robot alignment arm and the second robot alignment arm to raise and lower the transfer robot to adjust a position of the transfer robot in a vertical direction and in a horizontal direction. The transfer robot is configured to fold into a folded configuration having a narrow profile occupying less than 50% of an overall depth of the ATV transfer module.

17 Claims, 7 Drawing Sheets

Related U.S. Application Data division of application No. 16/493,145, filed as application No. PCT/US2018/022397 on Mar. 14, 2018, now Pat. No. 11,521,869.

(60) Provisional application No. 62/471,478, filed on Mar. 15, 2017.

(56) References Cited

U.S. PATENT DOCUMENTS

| | | | | |
|---|---|---|---|---|
| 5,934,856 | A * | 8/1999 | Asakawa | H10P 72/0452 414/217 |
| 6,142,722 | A | 11/2000 | Genov et al. | |
| 7,066,707 | B1 * | 6/2006 | Bonora | H10P 72/3411 414/744.3 |
| 7,246,985 | B2 | 7/2007 | Ferrara | |
| 7,351,291 | B2 * | 4/2008 | Murakami | H10P 72/0454 156/345.31 |
| 7,624,772 | B2 * | 12/2009 | Iwabuchi | H10P 72/0602 156/345.31 |
| 8,137,467 | B2 | 3/2012 | Meinhold et al. | |
| 8,673,080 | B2 | 3/2014 | Meinhold et al. | |
| 8,851,008 | B2 | 10/2014 | Fukutomi et al. | |
| 9,159,600 | B2 | 10/2015 | Mizokawa et al. | |
| 9,299,598 | B2 | 3/2016 | Blank | |
| 9,476,120 | B2 | 10/2016 | Meinhold et al. | |
| 10,221,484 | B2 | 3/2019 | Meinhold et al. | |
| 10,278,501 | B2 | 5/2019 | Weiss et al. | |
| 10,584,415 | B2 | 3/2020 | Meinhold et al. | |
| 10,679,878 | B2 | 6/2020 | Sakata | |
| 11,521,869 | B2 | 12/2022 | Gould et al. | |
| 11,804,393 | B2 | 10/2023 | Choi et al. | |
| 11,908,714 | B2 | 2/2024 | Gould et al. | |
| 2001/0020199 | A1 | 9/2001 | Bacchi et al. | |
| 2002/0057955 | A1 | 5/2002 | Tsubota et al. | |
| 2005/0232727 | A1 | 10/2005 | Ferrara | |
| 2006/0182532 | A1 | 8/2006 | Okada et al. | |
| 2008/0206036 | A1 | 8/2008 | Smith et al. | |
| 2010/0215460 | A1 | 8/2010 | Watanabe et al. | |
| 2012/0201634 | A1 | 8/2012 | Hiroki | |
| 2013/0071218 | A1 | 3/2013 | Hosek et al. | |
| 2013/0183122 | A1 | 7/2013 | Mizokawa et al. | |
| 2014/0031982 | A1 | 1/2014 | Yamada | |
| 2015/0007173 | A1 | 1/2015 | Ionescu et al. | |
| 2015/0013910 | A1 | 1/2015 | Krupyshev et al. | |
| 2015/0030771 | A1 | 1/2015 | Gelatos et al. | |
| 2015/0071737 | A1 | 3/2015 | Hofmeister et al. | |
| 2015/0179488 | A1 | 6/2015 | Blank | |
| 2015/0311102 | A1 | 10/2015 | Weiss et al. | |
| 2016/0111309 | A1 | 4/2016 | Lill et al. | |
| 2016/0133494 | A1 | 5/2016 | Thirunavukarasu et al. | |
| 2017/0040204 | A1 | 2/2017 | Kim et al. | |
| 2020/0083071 | A1 | 3/2020 | Gould et al. | |
| 2023/0141856 | A1 | 5/2023 | Shibata et al. | |
| 2025/0029860 | A1 | 1/2025 | Blank | |

FOREIGN PATENT DOCUMENTS

| | | | |
|---|---|---|---|
| JP | 2002518838 | A | 6/2002 |
| JP | 2004006665 | A | 1/2004 |
| JP | 2004265947 | A | 9/2004 |
| JP | 2005527966 | A | 9/2005 |
| JP | 2006303013 | A | 11/2006 |
| JP | 2007533167 | A | 11/2007 |
| JP | 2016540374 | A | 12/2016 |
| KR | 20050092278 | A | 9/2005 |
| KR | 20080054759 | A | 6/2008 |
| KR | 20090020167 | A | 2/2009 |
| KR | 100998663 | B1 | 12/2010 |
| KR | 20150073876 | A | 7/2015 |
| KR | 20170017538 | A | 2/2017 |
| TW | 202117821 | A | 5/2021 |
| WO | WO-9748126 | A1 | 12/1997 |
| WO | WO-9965083 | A1 | 12/1999 |
| WO | WO-9965803 | A1 | 12/1999 |
| WO | WO-03021645 | A2 | 3/2003 |
| WO | WO-2006041530 | A2 | 4/2006 |
| WO | WO-2015057959 | A1 | 4/2015 |

OTHER PUBLICATIONS

EP Extended European Search report dated Dec. 7, 2020 in EP Application No. 18767005.4.

EP Extended European Search report dated Nov. 29, 2024 in EP Application No. 24200642.7.

EP Office Action dated Jul. 6, 2022, in EP Application No. 18767005.4.

International Preliminary Report on Patentability and Written Opinion dated May 23, 2024 in PCT Application No. PCT/US2022/079585.

International Search Report and Written Opinion dated Jun. 25, 2018 in PCT Application No. PCT/US2018/022397.

International Search Report and Written Opinion dated Mar. 16, 2023 in PCT Application No. PCT/US2022/079585.

JP Office Action dated Jul. 9, 2024 in JP Application No. 2023-76062, with English Translation.

JP Office Action dated Mar. 29, 2022 in JP Application No. 2019-548638.

KR Office Action dated Aug. 23, 2022 in KR Application No. 10-2019-7030174.

KR Office Action dated May 11, 2024 in KR Application No. 10-2023-7030422 with English translation.

Translation of First Office Action corresponding to Taiwanese Application No. 111116765, 4 pages.

TW Office Action dated Feb. 8, 2022 in TW Application No. 107108573.

TW Office Action dated Jun. 23, 2021 in TW Application No. 107108573.

U.S. Non-Final Office Action dated Jul. 5, 2023 in U.S. Appl. No. 17/981,997.

U.S. Non-Final Office Action dated Mar. 18, 2022 in U.S. Appl. No. 16/493,145.

U.S. Non-Final Office Action dated Oct. 7, 2020 in U.S. Appl. No. 16/493,145.

U.S. Notice of Allowance dated Aug. 4, 2022 in U.S. Appl. No. 16/493,145.

U.S. Notice of Allowance dated Oct. 18, 2023 in U.S. Appl. No. 17/981,997.

U.S. Notice of Allowance dated Sep. 29, 2022 in U.S. Appl. No. 16/493,145.

U.S. Appl. No. 18/708,586, inventors Blank R, filed on May 8, 2024.

EP Office Action dated Apr. 2, 2026 in EP Application No. 24200642.7.

JP Office Action dated Dec. 9, 2025 in JP Application No. 2024-221226, with English Translation.

JP Office Action dated May 26, 2026 in JP Application No. 2024-221226, with English translation.

KR Office Action dated Sep. 19, 2025 in KR Application No. 10-2025-7007190, with English Translation.

TW Office Action and Search Report dated Mar. 4, 2026 in TW Application No. 111142960, with English Translation.

U.S. Non-Final Office Action dated Feb. 3, 2026 in U.S. Appl. No. 18/708,586.

* cited by examiner

TRANSFER ROBOT FOR REDUCED FOOTPRINT PLATFORM ARCHITECTURE

CROSS-REFERENCE TO RELATED APPLICATION

The present disclosure is a continuation of U.S. application Ser. No. 17/981,997, filed on Nov. 7, 2022, which is a divisional of U.S. patent application Ser. No. 16/493,145, filed on Sep. 11, 2019, which is a 371 U.S. National Phase of International Application No. PCT/US2018/022397, filed Mar. 14, 2018 and claiming the benefit of U.S. Provisional Application No. 62/471,478, filed on Mar. 15, 2017. The entire disclosures of the applications referenced above are incorporated herein by reference.

FIELD

The present disclosure relates to substrate processing systems, and more particularly to configurations of substrate processing tools in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to perform deposition, etching and/or other treatment of substrates such as semiconductor wafers. During processing, a substrate is arranged on a substrate support in a processing chamber of the substrate processing system. Gas mixtures including one or more precursors are introduced into the processing chamber and plasma may be struck to activate chemical reactions.

The substrate processing system may include a plurality of substrate processing tools arranged within a fabrication room. Each of the substrate processing tools may include a plurality of process modules. Typically, a substrate processing tool includes up to 6 process modules.

Referring now to FIG. 1, a top-down view of an example substrate processing tool 100 is shown. The substrate processing tool 100 includes a plurality of process modules 104. For example only, each of the process modules 104 may be configured to perform one or more respective processes on a substrate. Substrates to be processed are loaded into the substrate processing tool 100 via ports of a loading station of an atmosphere-to-vacuum (ATV) transfer module, such as an equipment front end module (EFEM) 108, and then transferred into one or more of the process modules 104. For example, a transfer robot 112 is arranged to transfer substrates from loading stations 116 to airlocks, or load locks, 120, and a vacuum transfer robot 124 of a vacuum transfer module 128 is arranged to transfer substrate from the load locks 120 to the various process modules 104.

SUMMARY

An atmosphere-to-vacuum (ATV) transfer module for a substrate processing tool includes a first side configured to interface with at least one loading station, a transfer robot assembly arranged within the ATV transfer module, and a second side opposite the first side. The transfer robot assembly is configured to transfer substrates between the at least one loading station and at least one load lock arranged between the ATV transfer module and a vacuum transfer module (VTM). The second side is configured to interface with the at least one load lock. The transfer robot assembly is arranged adjacent to the second side, and the at least one load lock extends through the second side into an interior volume of the ATV transfer module.

In other features, at least approximately 30% of the at least one load lock is located within the interior volume of the ATV transfer module. At least approximately 50% of the at least one load lock is located within the interior volume of the ATV transfer module. At least approximately 70% of the at least one load lock is located within the interior volume of the ATV transfer module.

In other features, the ATV transfer module corresponds to an equipment front end module (EFEM). The at least one load lock includes a first load lock and a second load lock arranged above the first load lock. The at least one loading station includes a first loading station and a second loading station arranged above the first loading station. The transfer robot assembly is configured to access the first load lock and the second load lock.

In other features, the ATV transfer further includes a lateral rail and a vertical rail mounted on the lateral rail. The transfer robot assembly is mounted on the vertical rail and is configured to raise and lower in a vertical direction on the vertical rail, and the vertical rail is configured to slide in a horizontal direction on the lateral rail. The transfer robot assembly includes two arms, each of the arms includes an arm segment and an end effector, and a length of the end effector is greater than a length of the arm segment. The length of the end effector is twice the length of the arm segment. When the transfer robot assembly is in a folded configuration, the arm segments and the end effectors are coaxial.

In other features, the transfer robot assembly includes a transfer robot platform configured to support a transfer robot. The transfer robot assembly is configured to raise and lower the transfer robot platform to adjust a position of the transfer robot platform in a vertical direction and adjust the position of the transfer robot platform in a horizontal direction. The transfer robot assembly includes a first robot alignment arm and a second robot alignment arm configured to adjust the position of the transfer robot platform. The transfer robot includes an arm having (i) an arm segment and (ii) an end effector.

In other features, a substrate processing tool includes the ATV transfer module and further includes the VTM. The VTM includes a plurality of process modules and the plurality of process modules includes at least three process modules arranged on a first side of the VTM and at least three process modules arranged on a second side of the VTM opposite the first side. The plurality of process modules includes process modules in a vertically stacked configuration.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

The present disclosure will become more fully understood from the detailed description and the accompanying drawings, wherein.

In the drawings, reference numbers may be reused to identify similar and/or identical elements.

DETAILED DESCRIPTION

Figure 2A:
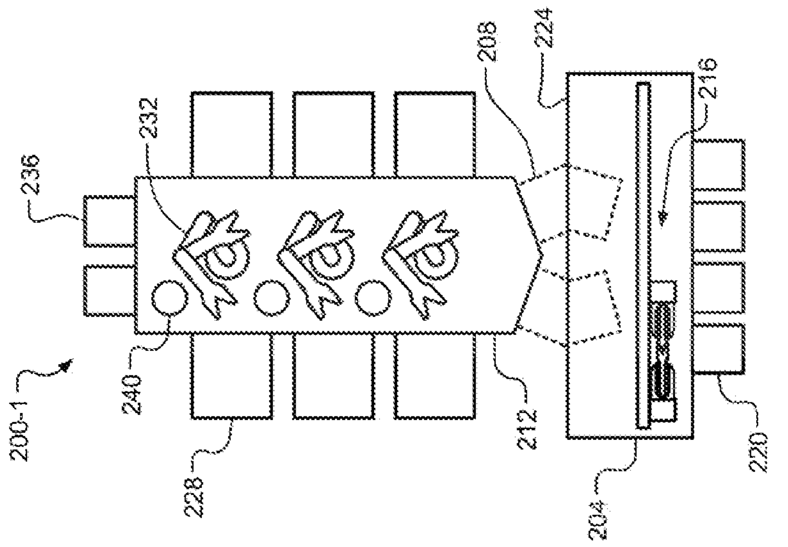
FIGS. 2A through 2D are plan views of example configurations of substrate processing tools including six process modules.
Figure 1:
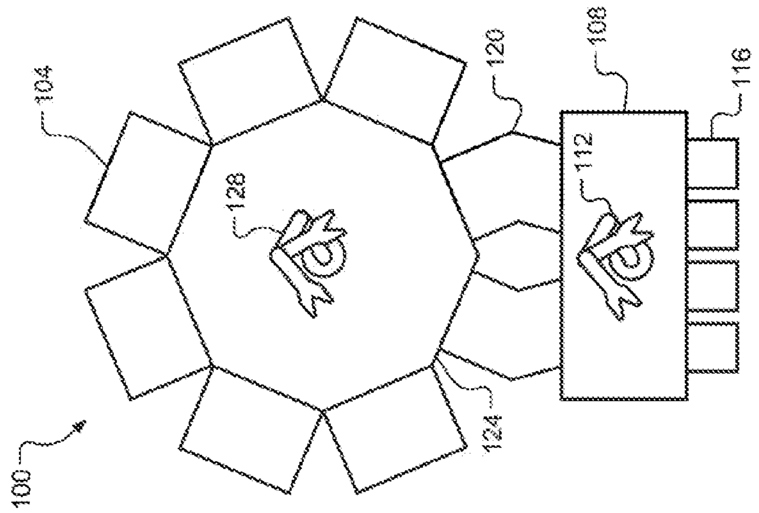
FIG. 1 (Prior Art)
FIG. 1 is an example substrate processing tool.

The quantity, position, etc. of substrate processing tools within a fabrication room may be constrained by the dimensions and respective configurations of the substrate processing tools. Accordingly, the configurations of the substrate processing tools define a tool footprint, spacing, and/or pitch, which further define a tool density of the fabrication room. Tool density may refer to a number of substrate processing tools and/or process modules per unit area of a fabrication room. Systems and methods according to the principles of the present disclosure provide various substrate processing tool configurations to maximize substrate processing tool density.

For example, an equipment front end module (EFEM) of a substrate processing tool may include one or more transfer robots for transferring substrates between the EFEM and load locks arranged between the EFEM and a vacuum transfer module (VTM). An internal volume of the EFEM must be sufficient to accommodate the transfer robot. Accordingly, the load locks are typically located outside of a footprint of an equipment front end module (EFEM) between the EFEM and the VTM. Systems and methods according to the principles of the present disclosure implement modified airlocks configured to reduce a footprint of a substrate processing tool. In some examples, the EFEM may include a transfer robot having a configuration that allows the airlocks to be located at least partially within the EFEM.

FIGS. 2A, 2B, 2C, and 2D show plan views of example configurations of a first substrate processing tool 200-1, a second substrate processing tool 200-2, and a third substrate processing tool 200-3 (referred to collectively as substrate processing tools 200) according to the principles of the present disclosure. Each of the processing tools 200 includes a modified equipment front end module (EFEM) 204 configured to accommodate at least a portion of load locks 208. In other words, instead of being located outside of the EFEM 204 in a gap between the EFEM 204 and a vacuum transfer module (VTM) 212, the load locks 208 extend into an interior of the EFEM 204. For example, at least approximately 50% (e.g., 45-55%) of the overall external length or volume of the load locks 208 may be located within the EFEM 204. In some examples, at least approximately 70% (e.g., 65-75%) of the overall external length or volume of the load locks 208 are located within the EFEM 204. In other examples, at least approximately 30% (e.g., 25-35%) of the overall external length or volume of the load locks 208 is located within the EFEM 204. Accordingly, the EFEM 204 can be located closer to the VTM 212, reducing the overall footprint and increasing the pitch of the tools 200. For example, a transfer robot 216 of the EFEM 204 according to the present disclosure is arranged closer to loading stations 220 on a front wall (e.g., a first side) than a back wall 224 (e.g., a second side) of the EFEM 204 to provide space for the load locks 208 to extend into the interior of the EFEM 204. The EFEM 204 and the transfer robot 216 are described below in more detail in FIG. 3. In some examples, the load locks 208 may be configured as shown in an alternative arrangement of the tool 200-3 in FIG. 2D. For example only, the loading stations 220 may correspond to front opening unified pods (FOUPs).

Figure 2D:
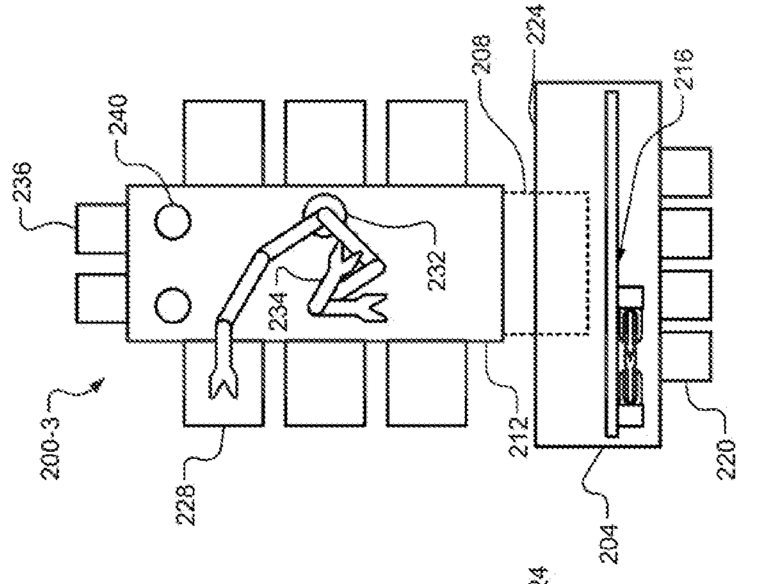
Figure 2C:
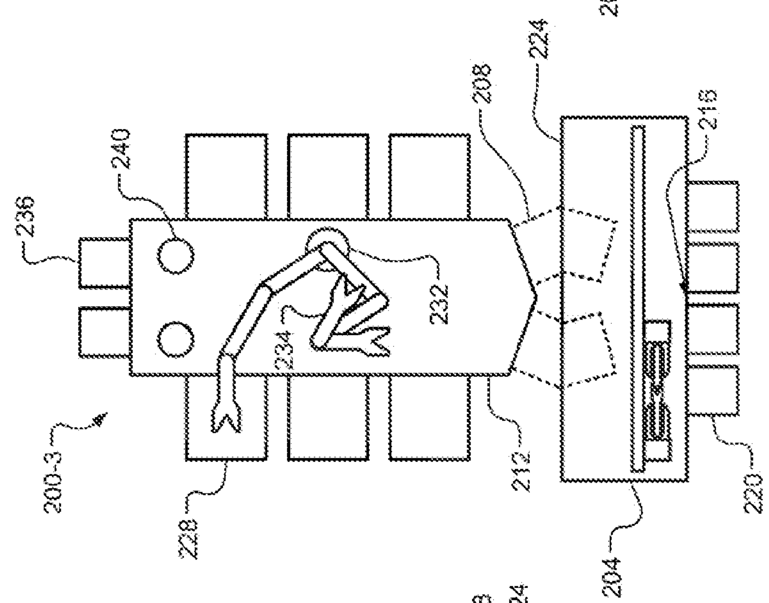
Figure 2B:
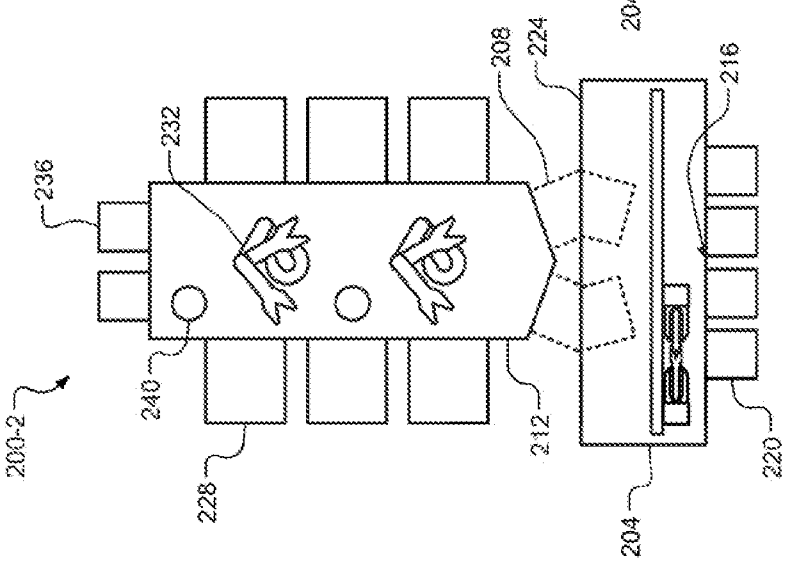

As shown, the tools 200 include six process modules 228. However, other configurations of the tools 200 may include more than six of the process modules 228. For example, a length of the VTM 212 may be extended to accommodate additional process modules 228. Similarly, the VTM 212 may include vacuum transfer robots 232 having various configurations. For example, the tool 200-1 includes three vacuum transfer robots 232 and the tool 200-2 includes two vacuum transfer robots 232. In the tools 200-1 and 200-3, the robots 232 are aligned with a center lengthwise axis of the VTM 212. Conversely, the tool 200-3 includes a single vacuum transfer robot 232 arranged off-center (i.e. shifted to the right or left toward the process modules 228) relative to the center lengthwise axis of the VTM 212. In other words, a primary pivot point of the robot 232 is off-center. Although shown having one or two arms, each of the robots 216 and 232 may have configurations including one, two, or more arms. In some examples, the robot 232 may include two end effectors 234 on each of the arms as shown in FIGS. 2C and 2D.

The substrate processing tools 200 may include one or more storage buffers 236 configured to store one or more substrates between processing stages. In some examples, storage buffers 240 may be located within the VTM 212. In some examples, one or more of the storage buffers 236 may be replaced with process modules or other components.

In some examples, one or more of the EFEM 204, the load locks 208, the VTM 212, and the process modules 228 may have a stacked configuration as described below in more detail. For example, each of the process modules 228 may correspond to two process modules 228 in a vertically stacked configuration (i.e., one process module 228 arranged above/below the other), the VTM 212 may correspond to two VTMs 212 in the vertically stacked configuration, each of the load locks 208 may correspond to two load locks 208 in the vertically stacked configuration, and each of the loading stations 220 may correspond to two loading stations 220 in the vertically stacked configuration. A height of the EFEM 204 may be increased to allow the robot 216 to be raised and lowered to different levels within the EFEM 204 to access multiple levels of the loading stations 220 and the load locks 208.

FIGS. 3A, 3B, 3C, and 3D show an example EFEM 300 and transfer robot assembly 304 according to the principles of the present disclosure. The assembly 304 may be mounted to one or more vertical rails 308 within the EFEM 300, which are in turn mounted on a lateral rail 312. The assembly 304 is configured to raise and lower in a vertical, Z direction on the vertical rails 308. For example, the assembly 304 may be mounted in slots 316 in the vertical rails 308. Conversely, the assembly 304 is configured to slide in a horizontal, X direction with the vertical rails 308 along the horizontal rail 312. In this manner, a position of the assembly 304 may be adjusted in the Z direction and the X direction to provide access to load locks 320 and loading stations 324 at different heights (i.e., levels).

In one example, the transfer robot assembly 304 includes two arms 328, each including an arm segment 332 and an end effector 336. For example only, the end effector 336 may be longer than the arm segment 332. In one example, a length L2 of the end effector 336 is twice a length L1 of the arm segment 332 (e.g., L2=~2*L1). A length L2 of the end effector 336 corresponds to a distance between an approximate center of a substrate support end of the end effector 336 and a pivot point of the end effector 336 (i.e., a pivot point of the end effector 336 relative to the arm segment 332. A length L1 of the arm segment 332 corresponds to a distance between pivot points of the arm segment 332 (i.e., the pivot point of the end effector 336 relative to the arm segment 332 and a pivot point of the arm segment 332 relative to a base of the transfer robot assembly 304. The greater length L2 of the end effector 336 relative to the length L1 of the arm segment 332 allows the end effector 336 to access the load locks 320 without requiring the arm segment 332 to also enter the load locks 320.

When in a folded configuration as shown, the assembly 304 has a relatively narrow profile (e.g., in accordance with dimensions of the substrate being transported) relative to the EFEM 300. Accordingly, the EFEM is configured to accommodate at least a portion of the load locks 320. The assembly 304 may include an integrated substrate aligner 340. In this example, the greater length L2 of the end effectors 336 allows the end effectors 336 to be positioned over the substrate aligner 340 when the transfer robot assembly 304 is in the folded configuration shown in FIG. 3C. For example, the relative lengths of the arm segments 332 and the end effectors 336 allow a relatively linear folded configuration where the arm segments 332, the end effectors 336, and the substrate aligner 340 are aligned on a line 344 (i.e., coaxial with the line 344).

Figure 3B:
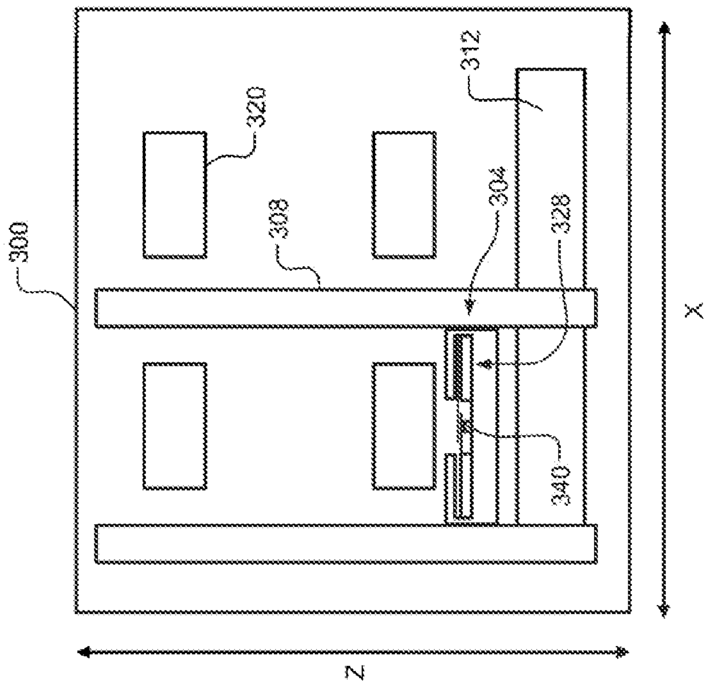
FIGS. 3A through 3D show an example equipment front end module and transfer robot.
Figure 3A:
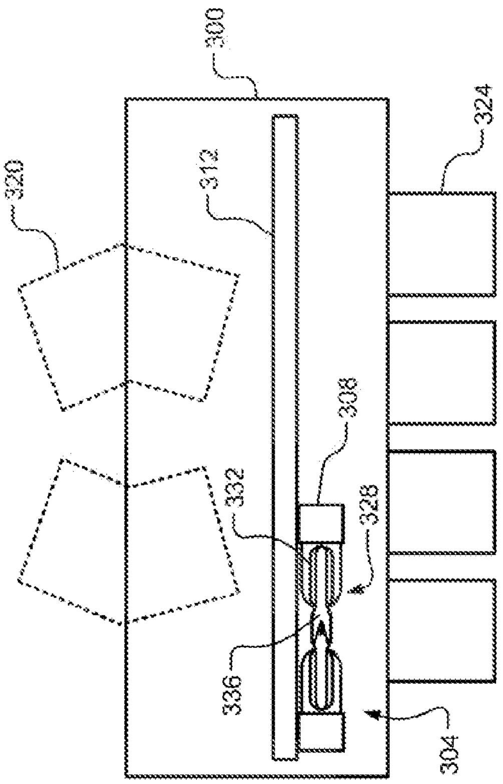
Figure 3C:
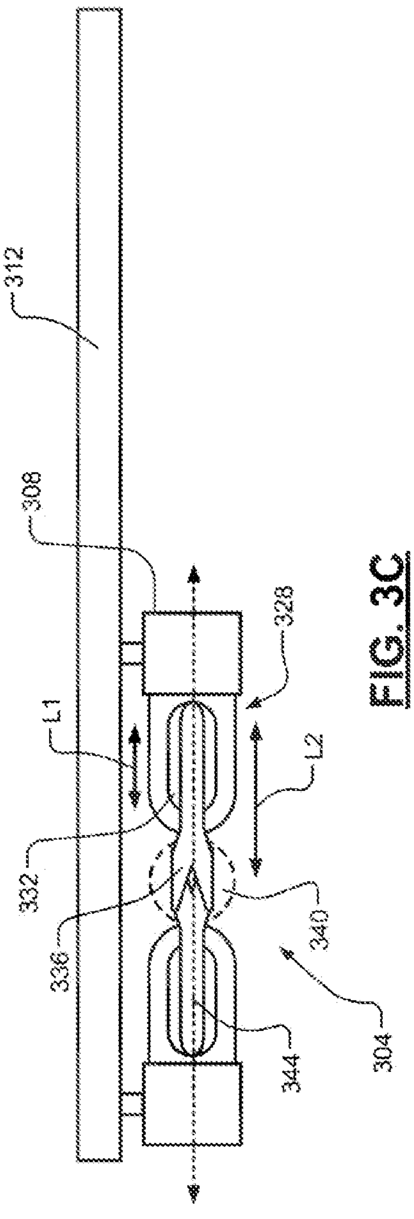
Figure 3D:
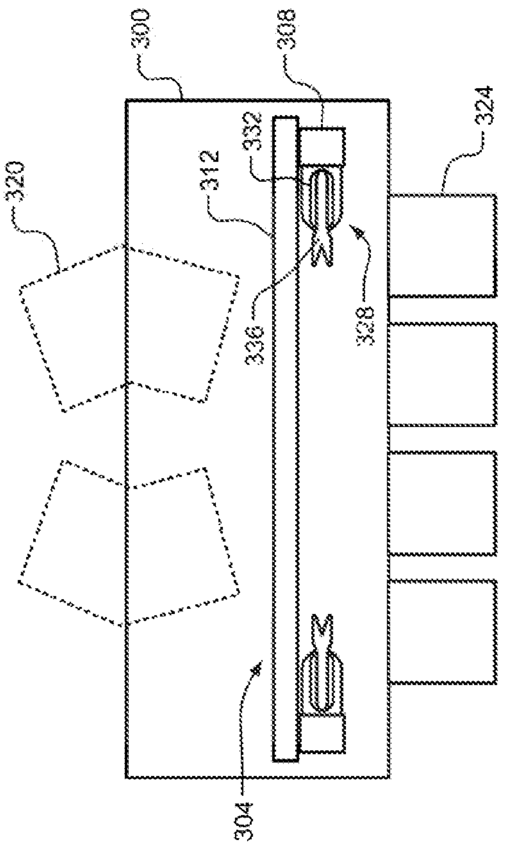

Each of the arms 328 may be mounted in the slot 316 of a respective one of the vertical rails 308. For example, the vertical rails 308 may move independently of one another. In other words, although shown in a compact arrangement in FIGS. 3A, 3B, and 3C (i.e., the vertical rails 308 are relatively close together), one of the rails 308 may be moved to an end of the EFEM 300 opposite to the other one of the rails 308 as shown in FIG. 3D. In this manner, the respective arms 328 are configured to access different ones of the loading stations 324 and/or the load locks 320 at the same time. In other examples, the EFEM 300 may include only one of the vertical rails 308 and a respective one of the arms 328.

In some examples, the additional space within the EFEM 300 achieved by the configuration of the transfer robot assembly 304 may allow additional substrate processing and transfer system components to be located within the EFEM 300. For example, components including, but not limited to, metrology stations, storage buffers, notch alignment stations, edge ring storage, etc. may be located in the EFEM 300. In one example, when in the folded configuration, the transfer robot assembly 304 occupies less than 50% of an overall depth of the EFEM 300.

Figure 4A:
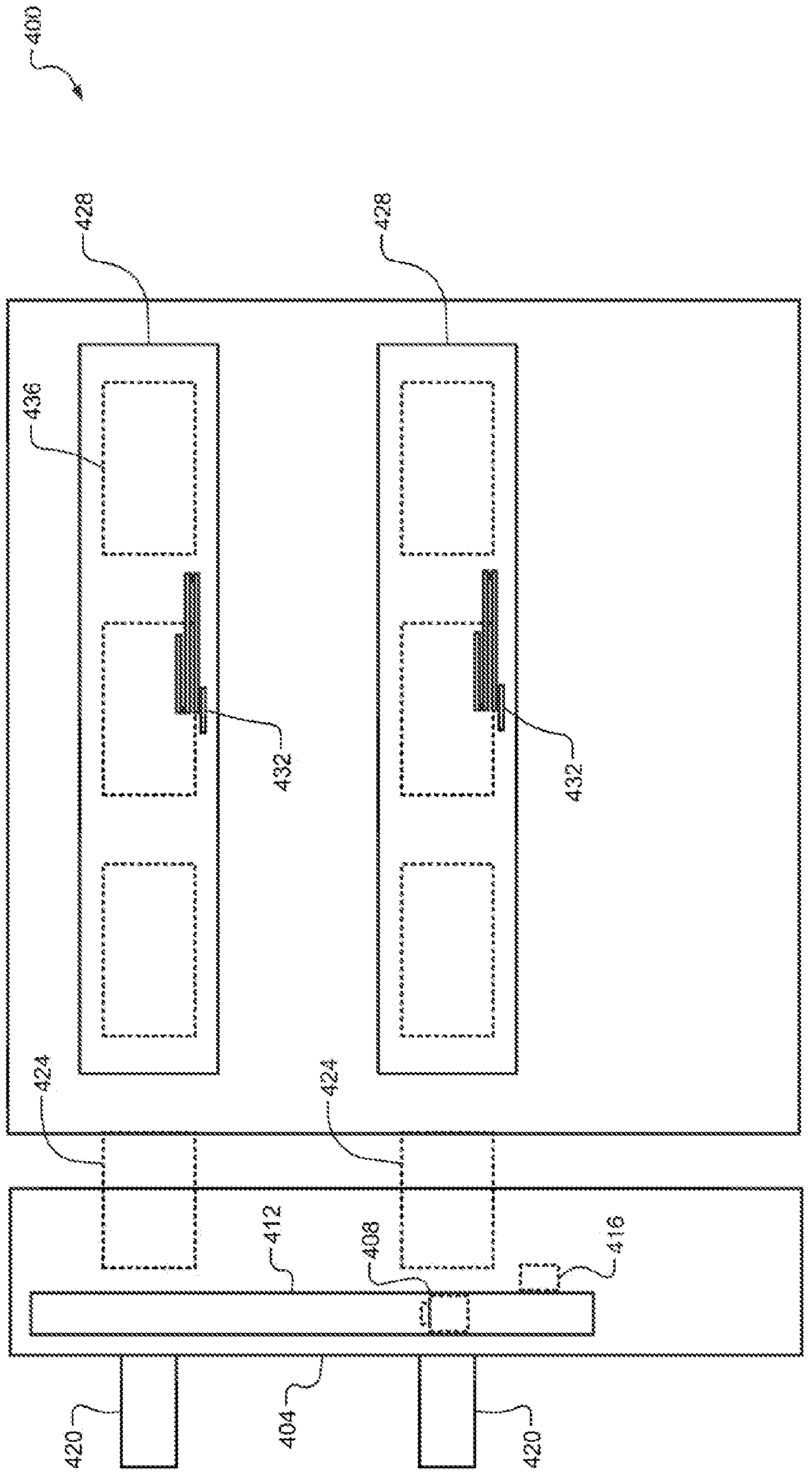
FIG. 4A is a side view of an example substrate processing tool.

FIG. 4A shows a side view of an example substrate processing tool 400 in a dual, vertically stacked configuration. The substrate processing tool 400 includes an EFEM 404 having an extended height to accommodate a transfer robot assembly 408 as described above in FIGS. 3A-3C. The transfer robot assembly 408 is configured to be raised and lowered on vertical rails 412 and a horizontal rail 416 to access vertically stacked loading stations 420 and load locks 424. The load locks 424 are located at least partially within the EFEM 404.

The tool 400 includes vertically stacked VTMs 428. Each of the VTMs 428 includes one or more vacuum transfer robots 432. The vacuum transfer robots 432 are configured to transfer substrates between the load locks 424 and vertically stacked process modules 436.

Figure 4B:
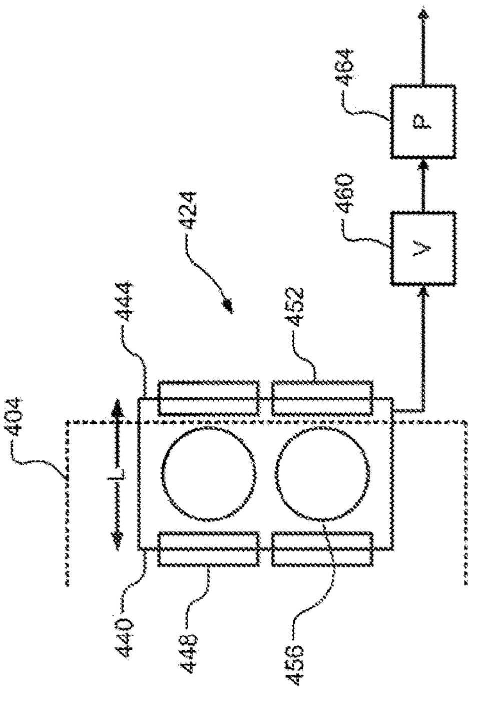
FIG. 4B is a plan view of an example load lock located within an equipment front end module.

FIG. 4B shows a plan view of an example one of the load locks 424 located within the EFEM 404. As shown, greater than 70% of an overall external length (e.g., a length L from a first outer wall 440 to a second outer wall 444) of the load lock 424 is located within the EFEM 404. Substrates are transferred from the EFEM 404 to the load lock 424 (e.g., using the transfer robot assembly 408) via ports 448 located inside an interior volume of the EFEM 404. Conversely, substrates are transferred from the load lock 424 to the VTM 428 via ports 452. As shown, the load lock 424 includes two loading stations 456, two of the ports 448, and two of the ports 452.

A valve 460 and pump 464 may be operated to pump down and maintain the load lock 424 at vacuum, purge the load lock 424, etc. In some examples, the valve 460 interfaces with the load lock 424 on a surface outside of the EFEM 404. In other examples, the valve 460 interfaces with the load lock 424 on a surface within the EFEM 404.

Figure 5B:
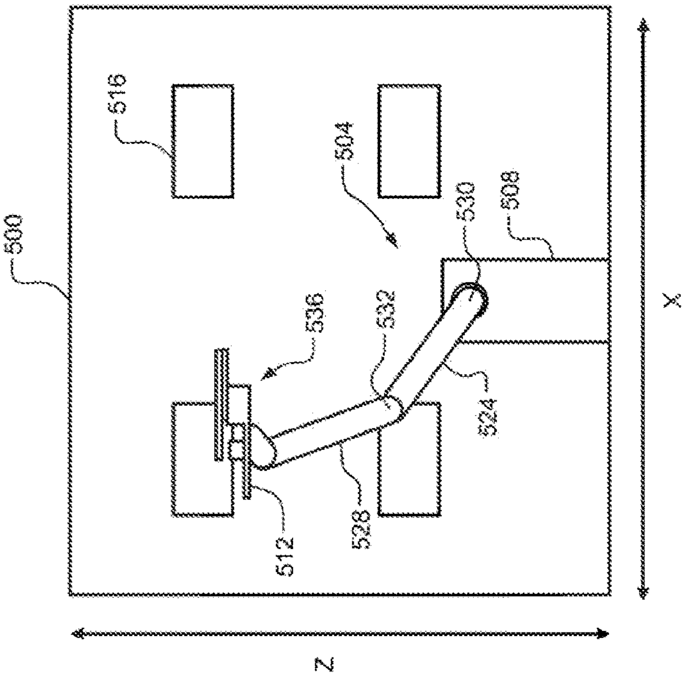
FIGS. 5A through 5C show another example equipment front end module and transfer robot.
Figure 5C:
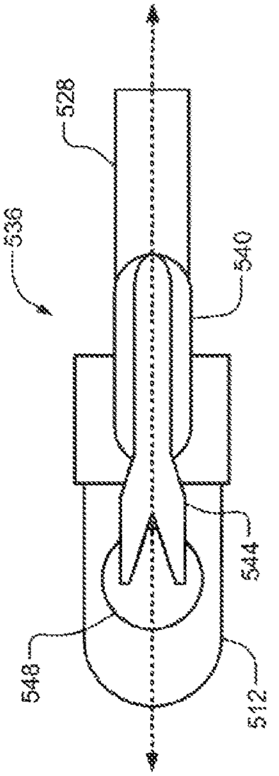
Figure 5A:
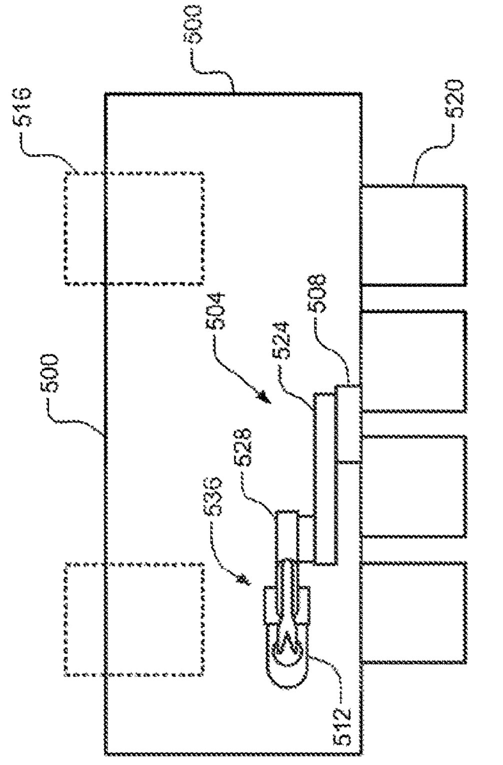

FIGS. 5A, 5B, and 5C show another example EFEM 500 and transfer robot assembly 504. For example, the EFEM 500 and the transfer robot assembly 504 may be implemented in any of the substrate processing tools 200 of FIGS. 2A-2D. The assembly 504 may be mounted within a front end region (i.e., a loading station side) of the EFEM 500. For example, the assembly 504 may be coupled to a mounting chassis 508 arranged in the front end region of the EFEM 500. The assembly 504 is configured to both raise and lower a transfer robot platform 512 in a vertical, Z direction and adjust a lateral position of the platform 512 in a horizontal, X direction. In this manner, a position of the assembly platform 512 may be adjusted in the Z direction and the X direction to provide access to load locks 516 and loading stations 520 at different heights (i.e., levels).

In one example, the transfer robot assembly 504 includes two robot alignment arms 524 and 528 configured to actuate about pivot points 530 and 532 (which may include corresponding motors) to adjust a position of the platform 512. The platform 512 supports a transfer robot 536. The transfer robot 536 includes an arm comprising an arm segment 540 and an end effector 544. When in a folded configuration as shown, the assembly 504 and the transfer robot 536 have a relatively narrow profile (e.g., in accordance with dimensions of the substrate being transported) relative to the EFEM 500. Accordingly, the EFEM 500 is configured to accommodate at least a portion of the load locks 516 in a manner similar to the EFEM 300 of FIGS. 3A-3D. In some examples, the platform 512 may include an integrated substrate aligner 548. In this example, the end effector 544 is positioned over the substrate aligner 548 when the transfer robot 536 is in the folded configuration shown in FIGS. 5A, 5B, and 5C. The transfer robot 536 has a relatively linear folded configuration where the arm segment 540, the end effector 544, and the substrate aligner 548 are aligned on a line 552 (e.g., coaxial with the line 552).

In some examples, the additional space within the EFEM 500 achieved by the configuration of the transfer robot assembly 504 may allow additional substrate processing and transfer system components to be located within the EFEM 500. For example, components including, but not limited to, metrology stations, storage buffers, notch alignment stations, edge ring storage, etc. may be located in the EFEM 500. In one example, when in the folded configuration, the transfer robot assembly 504 occupies less than 50% of an overall depth of the EFEM 500.

Although FIGS. 3A-3D and FIGS. 5A-5C show the EFEMs 300 and 500 arranged to access vertically stacked loading stations and load locks, in other examples the EFEMs 300 and 500 may be implemented in substrate processing tools that do not include vertically stacked configurations. For example, some substrate processing tools may include loading stations, load locks, and/or process modules that are arranged at a greater height on/within the tool, that have access slots that are arranged higher on the loading station, load lock, and/or process modules, etc.

Figure 6A:
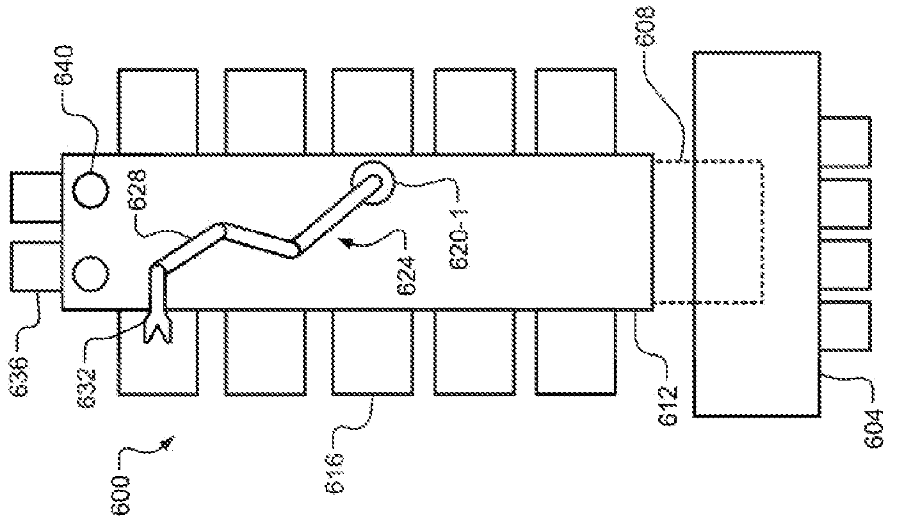
FIGS. 6A through 6C are plan views of example configurations of a substrate processing tool including ten process modules.
Figure 6B:
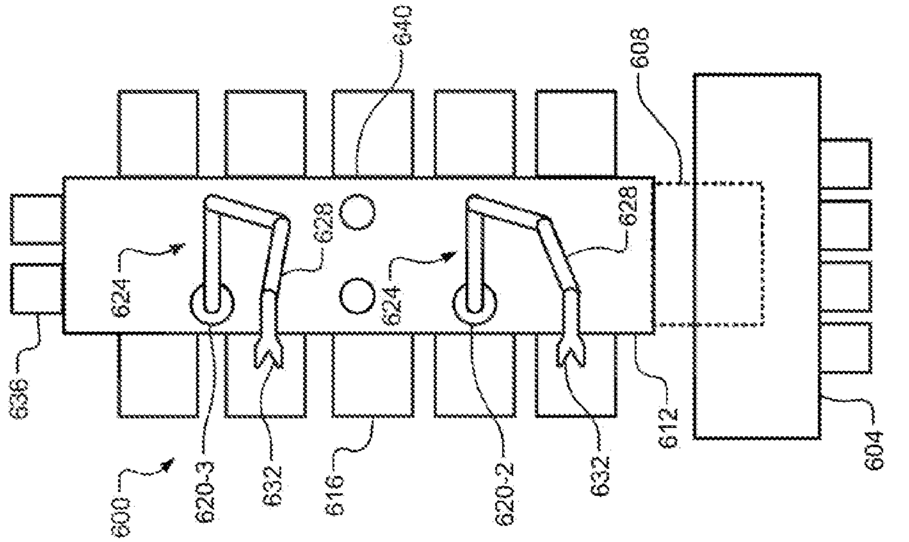
Figure 6C:
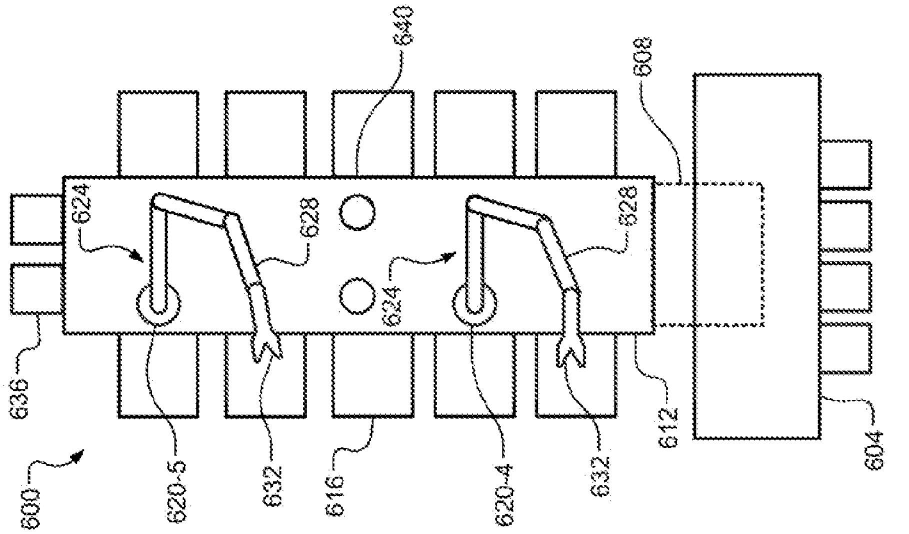

FIGS. 6A, 6B, and 6C show plan views of example configurations of another substrate processing tool 600 according to the principles of the present disclosure. The processing tool 600 includes a modified equipment front end module (EFEM) 604 configured to accommodate at least a portion of one or more load locks 608. In other words, instead of being located entirely outside of the EFEM 604 in a gap between the EFEM 604 and a vacuum transfer module (VTM) 612, the load locks 608 extend into an interior of the EFEM 604. Accordingly, the EFEM 604 can be located closer to the VTM 612, reducing the overall footprint and increasing the pitch of a plurality of the tools 600. The EFEM 604 may be configured to include, for example, the transfer robot assembly 304 as described in FIGS. 3A-3D, the transfer robot assembly 504 as described in FIGS. 5A-5C, etc.

As shown, the tool 600 includes ten process modules 616. For example, a length of the VTM 612 may be extended to accommodate additional process modules 616. Similarly, the VTM 612 may include vacuum one or more transfer robots 620 (e.g., transfer robots 620-1, 620-2, 620-3, 620-4, and 620-5) having various configurations. As shown, the transfer robots 620 include one arm 624 having three arm segments 628 and one end effector 632 in each of the configurations. In other configurations, the transfer robots 620 may include one, two, or more arms 624. In some examples, the robots 620 may include two of the end effectors 632 on each of the arms 624.

As shown in FIG. 6A, the tool 600 includes a single vacuum transfer robot 620-1 arranged off-center (i.e. shifted to the right or left toward the process modules 616) relative to the center lengthwise axis of the VTM 612. In other words, a primary pivot point of the robot 620-1 is off-center. The robot 620-1 is positioned and configured to access each of the ten process modules 616 and the load lock(s) 608. In configurations where the tool 600 includes storage buffers 636 and/or storage buffers 640, the robot 620-1 is also configured to access the storage buffers 636/640.

As shown in FIGS. 6B and 6C, the tool 600 includes two vacuum transfer robot 620-2 and 620-3 or 620-4 and 620-5, respectively, arranged off-center (i.e. shifted to the right or left toward the process modules 616) relative to the center lengthwise axis of the VTM 612. The robots 620-2 and 620-4 are positioned and configured to access selected ones of the ten process modules 616 and the load lock(s) 608. Conversely, the robots 620-3 and 620-5 are positioned and configured to access others of the ten process modules 616. In configurations where the tool 600 includes storage buffers 636 and/or storage buffers 640, the robots 620-3 and 620-5 may also be configured to access the storage buffers 636, while both of the robots 620-2 and 620-3 in FIG. 6B and both of the robots 620-4 and 620-5 in FIG. 6A are configured to access the storage buffers 640.

For example, as shown in FIG. 6B, the robot 620-2 is aligned with (e.g., centered on a horizontal axis of) a respective one of the process modules 616 while the robot 620-3 is arranged centered between adjacent ones of the process modules 616. Conversely, as shown in FIG. 6C, each of the robots 620-4 and 620-5 is aligned with a respective one of the process modules 616.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including “connected,” “engaged,” “coupled,” “adjacent,” “next to,” “on top of,” “above,” “below,” and “disposed.” Unless explicitly described as being “direct,” when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean “at least one of A, at least one of B, and at least one of C.”

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate or substrate. The electronics may be referred to as the “controller,” which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. An atmosphere-to-vacuum (ATV) transfer module for a substrate processing tool, the ATV transfer module comprising:

a first side configured to interface with at least one loading station;

a second side, opposite the first side, configured to interface with at least a first load lock and a second load lock arranged between the ATV transfer module and a vacuum transfer module (VTM);

a transfer robot assembly arranged within the ATV transfer module, wherein the transfer robot assembly is configured to transfer substrates between (i) the at least one loading station and (ii) the first load lock and the second load lock; and a lateral rail and at least one vertical rail mounted on the lateral rail, wherein:

the transfer robot assembly is mounted on the at least one vertical rail and is configured to raise and lower in a vertical direction on the at least one vertical rail, the at least one vertical rail is configured to slide in a horizontal direction on the lateral rail, the at least one vertical rail includes a first vertical rail and a second vertical rail, the transfer robot assembly includes a first arm mounted on the first vertical rail and a second arm mounted on the second vertical rail, and each of the first arm and the second arm includes an arm segment and an end effector.

2. The ATV transfer module of claim 1, wherein for at least one of the end effectors, a length of that end effector is greater than a length of the arm segment supporting that end effector.

3. The ATV transfer module of claim 1, wherein for at least one of the end effectors, a length of that end effector is twice a length of the arm segment supporting that end effector.

4. The ATV transfer module of claim 3, wherein, when the transfer robot assembly is in a folded configuration, the arm segments and the end effectors have long axes that are aligned and the end effectors are positioned over the arm segments and pointing in opposite directions.

5. The ATV transfer module of claim 4, wherein the transfer robot assembly includes an integrated substrate aligner and wherein, when in the folded configuration, at least one of the end effectors is positioned over the integrated substrate aligner.

6. The ATV transfer module of claim 1, wherein the second vertical rail is configured to move independently of the first vertical rail such that the first arm and the second arm are configured to access different ones of the at least one loading station and different ones of the first load lock and the second load lock at a same time.

7. The ATV transfer module of claim 1, wherein the first arm and the second arm are configured to (i) access the at least one loading station at a same time and (ii) access one of the first load lock and the second load lock at a same time.

8. The ATV transfer module of claim 1, wherein at least one of the first load lock and the second load lock extends through the second side into an interior volume of the ATV transfer module.

9. The ATV transfer module of claim 8, wherein at least approximately 30% of the at least one of the first load lock and the second load lock is located within the interior volume of the ATV transfer module.

10. The ATV transfer module of claim 8, wherein at least approximately 50% of the at least one of the first load lock and the second load lock is located within the interior volume of the ATV transfer module.

11. The ATV transfer module of claim 8, wherein at least approximately 70% of the at least one of the first load lock and the second load lock is located within the interior volume of the ATV transfer module.

12. The ATV transfer module of claim 1, wherein the ATV transfer module is an equipment front end module (EFEM).

13. The ATV transfer module of claim 1, wherein the second load lock is arranged above the first load lock.

14. The ATV transfer module of claim 13, wherein the at least one loading station includes a first loading station and a second loading station arranged above the first loading station.

15. A substrate processing tool including the ATV transfer module of claim 1 and further comprising the VTM.

16. An atmosphere-to-vacuum (ATV) transfer module for a substrate processing tool, the ATV transfer module comprising:

a first side configured to interface with at least one loading station;

a second side, opposite the first side, configured to interface with at least a first load lock and a second load lock arranged between the ATV transfer module and a vacuum transfer module (VTM);

a transfer robot assembly arranged within the ATV transfer module, wherein the transfer robot assembly is configured to transfer substrates between (i) the at least one loading station and (ii) the first load lock and the second load lock; and a lateral rail, wherein the transfer robot assembly is mounted on the lateral rail and is configured to slide in a horizontal direction on the lateral rail to provide access to the first load lock and the second load lock, wherein:

the transfer robot assembly includes a first arm and a second arm, each of the first arm and the second arm includes an arm segment and an end effector, the transfer robot assembly has a folded configuration in which the arm segments and the end effectors of each of the first arm and the second arm have long axes that are aligned, the end effectors are positioned over the arm segments and point in opposite directions, and the end effectors overlap one another, and the second arm is configured to move along the lateral rail independently of the first arm such that the first arm and the second arm are configured to access different ones of the at least one loading station and different ones of the first load lock and the second load lock at a same time.

17. The ATV transfer module of claim 16, wherein the first arm and the second arm are configured to (i) access the at least one loading station at a same time and (ii) access one of the first load lock and the second load lock at a same time.

* * * * *